United States Patent
Weiner et al.

(10) Patent No.: US 7,081,293 B2
(45) Date of Patent: Jul. 25, 2006

(54) METALLIC NANOWIRE AND METHOD OF MAKING THE SAME

(75) Inventors: Anita M. Weiner, West Bloomfield, MI (US); Curtis A. Wong, Macomb Township, MI (US); Yang-Tse Cheng, Rochester Hills, MI (US); Michael P. Balogh, Novi, MI (US); Micheal J. Lukitsch, Port Huron, MI (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 11/027,794

(22) Filed: Dec. 30, 2004

(65) Prior Publication Data

US 2005/0266267 A1    Dec. 1, 2005

Related U.S. Application Data

(63) Continuation of application No. 10/352,767, filed on Jan. 28, 2003, now Pat. No. 6,841,013, which is a continuation of application No. 10/269,923, filed on Oct. 11, 2002, now Pat. No. 6,841,235.

(51) Int. Cl.
*B32B 15/01*    (2006.01)

(52) U.S. Cl. ............... 428/320.2; 428/577; 428/571; 428/687; 428/605

(58) Field of Classification Search .............. None
See application file for complete search history.

(56) References Cited

U.S. PATENT DOCUMENTS

| | | | |
|---|---|---|---|
| 6,159,831 A | 12/2000 | Thrush et al. | |
| 6,187,165 B1 | 2/2001 | Chien et al. | |
| 6,231,744 B1 | 5/2001 | Ying et al. | |
| 6,656,573 B1 * | 12/2003 | Chen et al. | 117/105 |
| 6,670,539 B1 | 12/2003 | Heremans et al. | |
| 6,709,929 B1 | 3/2004 | Zhang et al. | |
| 6,882,051 B1 * | 4/2005 | Majumdar et al. | 257/746 |
| 6,913,649 B1 * | 7/2005 | Voutsas et al. | 117/92 |
| 2002/0130311 A1 * | 9/2002 | Lieber et al. | 257/1 |
| 2002/0172820 A1 * | 11/2002 | Majumdar et al. | 428/357 |
| 2004/0255845 A1 * | 12/2004 | Voutsas et al. | 117/92 |
| 2005/0029678 A1 * | 2/2005 | Hanrath et al. | 257/784 |

* cited by examiner

*Primary Examiner*—Jennifer McNeil
*Assistant Examiner*—Jason L. Savage
(74) *Attorney, Agent, or Firm*—Kathryn A. Marra

(57) ABSTRACT

A metallic nanowire having an aspect ratio of at least 100 and a diameter less than 200 nanometers composed of at least one of bismuth, indium, tin, lead, zinc, antimony and alloys of the same and a method of making the same from a thin film composite.

8 Claims, 3 Drawing Sheets

METALLIC NANOWIRE AND METHOD OF MAKING THE SAME

CROSS-REFERENCE TO RELATED APPLICATIONS

This application is a continuation of U.S. Ser. No. 10/352,767, filed Jan. 28, 2003, Now U.S. Pat. No. 6,841,013 which is itself a continuation of pending U.S. Ser. No. 10/269,923, filed Oct. 11, 2002, now U.S. Pat. No. 6,841,235.

BACKGROUND OF THE INVENTION

1. Field of the Invention

This invention pertains to metallic nanowire structures and methods of making the same.

2. Brief Description of Relevant Art:

Nanowire structures have utility in various electronic and microelectronic applications. The unique electrical, optical, magnetic, catalytic, mechanical and tribological properties of such nanostructured materials provide numerous opportunities in a variety of applications. Various metallic compositions have been considered for integration into nanowire structures. Of particular interest are materials having characteristic properties which differ from various common metals in at least one aspect such as anisotropic Fermi surface, low carrier density, small carrier effective mass and long carrier mean free paths. Additional advantageous characteristics can include materials which exhibit very large positive magnetoresistance at room temperature. Such nanowire structures advantageously include metallic compounds which contain bismuth, tin, lead, indium, zinc, or antimony.

Heretofore, various approaches have been employed to produce metallic nanowires. Single filaments of materials such as bismuth with diameters in the micrometer range have been made using various processes such as the Taylor process. Nanowires containing materials such as bismuth having diameters as small as 200 plus nanometers have been fabricated using high pressure casting from a liquid phase. Additionally, porous alumina host media have been employed to produce metallic nanowires containing materials such as bismuth by pressure injection of molten bismuth or by infiltrating and condensing bismuth vapor into porous alumina channels. The resulting nanowire had a diameter between 10 and 200 nanometers. The resulting nanowires produced by the methods are characterized by multiple crystalline regions and essentially short finite lengths. The lengths of nanowires produced by such methods typically is one which provides an aspect ratio of length to diameter of 10 or less.

Thus, it would be desirable to produce a metallic nanowire having enhanced characteristics such as at least one of enhanced crystalline domain, elevated aspect ratio, small diameter and increased length. It is also desirable to provide a method whereby such nanowire material can be produced efficiently and economically in a highly reproducible manner.

SUMMARY OF THE INVENTION

The present invention is directed to a metallic nanowire and method of making the same. The metallic nanowire is composed of at least one of bismuth, indium, tin, lead, zinc, antimony, alloys containing bismuth, alloys containing indium, alloys containing tin, alloys containing lead, alloys containing zinc, and alloys containing antimony. The metallic material of the nanowire is present as at least one unitary elongated crystalline structure having an aspect ratio of at least 100 and diameter less than 500 nanometers.

The method for producing nanowires includes the steps of forming a composite film having at least one outwardly oriented surface. The composite film contains at least two phases and exhibits initial high compressive stress. The first phase of the composite film is a metallic material which exhibits a characteristic metallic material melting temperature. The metallic material of the first phase includes at least one of bismuth, indium, tin, lead, zinc, antimony, and alloys thereof. The second phase functions as a host matrix and has a melting temperature greater than the melting temperature of the metallic material. In the production method of the present invention, the initial high elevated compressive stress exhibited in the composite film is permitted to relax to a subsequent lower elevated compressive stress. The metallic material of the first phase is permitted to diffuse within the composite film and to emit from at least one initiation point located on the outwardly oriented surface of the composite film. The emission event occurs concurrently with the relaxation to the subsequent lower compressive stress value. The emitted metallic material exhibits an elongated crystalline metallic structure, and an aspect ratio of at least 100.

DETAILED DESCRIPTION OF THE EMBODIMENTS

Figure 1:
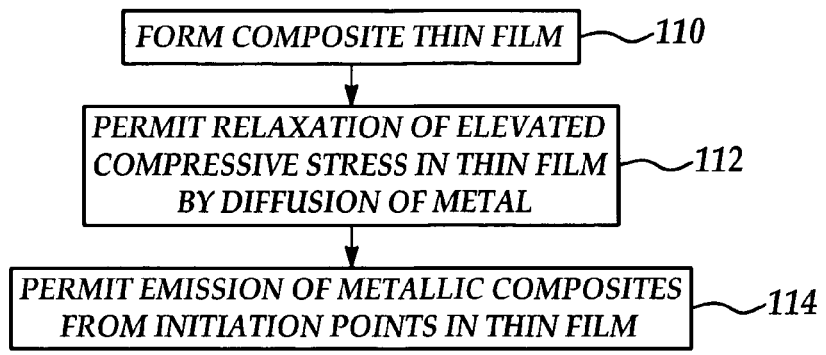
FIG. 1 is a process diagram of the nanowire formation method of an embodiment of the present invention.

The present invention is predicated, at least in part, on the unexpected discovery that metallic nanowires having extended single crystalline regions can be produced from composite film structures. The resulting nanowires are expected to exhibit enhanced transport properties which can be advantageously employed in a variety of end-use applications.

In the method of the present invention, a composite film is employed as the platform for preparing and producing nanowires. The composite film may be prepared by any suitable method which provides a thin film composed of two distinct phases having an outwardly oriented surface. The composite film includes a first phase which includes a metallic material. The first phase is surrounded by a second phase which functions as the host matrix. The second phase comprises a material which does not exhibit appreciable chemical or thermodynamic mixing with the metallic material of the first phase. More specifically, the host matrix material is one which cannot form an appreciable alloyed state with the metallic material of the first phase. Thus, the composite film employed in the method of the present invention is one which will remain as a composite exhibiting at least two phases during the nanowire production process. The composite film of the process has a host matrix together with regions of concentrated or accumulated metallic material. The host matrix is composed of a material which will permit controlled diffusion and/or accumulation of the metallic material of the first phase within the matrix. Controlled diffusion and/or accumulation may be accomplished as a result of any suitable inherent physical characteristic and/or external means. Preferably, controlled diffusion and/or accumulation of the metallic phase is accomplished, at least in part, by a differential which exists between the melting temperature of the first and second phases. Typically, the matrix material will have a melting temperature at least 30% greater than the melting temperature of the metallic material which makes up the first phase. The melting temperature differential can be greater as desired or required. Thus, the present invention contemplates melting temperature differentials in which the melting temperature of the matrix phase is as great as four to five times the melting temperature of the metallic material.

It is believed that the nature of the matrix material and its elevated melting temperature with respect to the metallic material permits diffusive movement of metallic phase material with respect to the host matrix. It is believed that the movement of metallic material facilitates microscopic extrusion through initiation points of stress concentration during the compressive stress relaxation phenomena.

The metallic material employed in the first phase is one which will provide desirable electrical, optical, magnetic, catalytic, mechanical and/or tribological properties in a nanostructured material. Such materials include bismuth, tin, lead, indium, and antimony. This invention also contemplates that the metallic material may be alloys containing one or more of the aforementioned metals. The materials of choice are ones which exhibit diffusion in the host matrix, preferably at temperatures at or near ambient or room temperature. The metallic materials of choice are also ones which demonstrate a suitable surface interaction with the associated matrix material such that a significant degree of filament formation occurs as metallic material is extruded from stress points in the film surface due to compressive stress inherent in the composite film. By the term "significant degree of filament formation" it is meant that the amount of nanowire formation is such that the nanowires can be produced and collected in an appropriate manner. Thus, the surface interaction between the matrix phase material and the metallic material of the first phase at the emission event is such that a significant degree of the metallic material emits as a nanowire rather than a surface coating. While it is contemplated that significant amounts of the first phase metallic material emit as a nanowire, some limited amount of coating phenomena may be tolerated provided that any coating phenomenon does not appreciably interfere with the nanowire formation.

The matrix material may be one which can maintain the desired metallic material in a dispersed yet diffusible state. Typically, the matrix material of choice will be one which will form an appropriate composite thin film with the metallic material contained therein and will exhibit an elevated degree of compressive stress upon initial film formation. As used herein, the term "elevated compressive stress" is defined as a compressive stress sufficient to initiate and sustain emission of metallic material from the host matrix in the form of a nanowire. Typically, initial elevated compressive stress of the composite film will be greater than about 200 MPa upon initial film formation. Greater initial compressive stress is also considered within the purview of this invention with compressive stress values between 200 MPa and 450 MPa being contemplated and compressive stress values over 450 MPa being considered within the purview of this invention. As used herein, the value of compressive stress is measured using the wafer curvature measurement technique and Stoney's equation as outlined in "Proceedings of the Royal Society," Vol. A82, page 172 (1909).

The host matrix phase can be any suitable material system which meets the aforementioned requirements and is essentially nonreactive with the metallic material employed in the first phase. Typically, such material systems are nitrides, carbides, oxides, and borides and carbon-based materials and their combinations being preferred. The typical nitride is, preferably, a complex of a material such as chrome nitride, aluminum oxides, boron carbides, titanium nitride, diamond-like carbon materials or the like.

The thin film from which the nanowire is emitted can be produced by any suitable coating method which will provide compressive stress in the composite thin film thus produced in the desired ranges. Films can be prepared on suitable substrates using methods such physical vapor deposition, chemical vapor deposition, plasma spray, thermal spray and the like.

The composite film thus formed will typically have a total thickness in a range sufficient to efficiently permit the emission of the metallic material in a nanowire structure. Typical film thicknesses are those less than about 10 micrometer ranges between about 0.5 and 5 micrometers being preferred and ranges between about 0.1 and about 2.0 micrometers being most preferred.

Referring to the process diagram of FIG. 1, in the process of the present invention, once the composite film has been formed at 110, relaxation of the initial elevated compressive stress is initiated at 112 thereby producing or promoting phase diffusion within the film concurrent with the relaxation of compressive stress. The diffusion of the metallic material of the first phase proceeds at a rate which generally corresponds to the rate of the relaxation compressive stress. Relaxation of compressive stress and diffusion produce emission of nanofiber material 114 at location(s) in and on the surface of the composite film. These locations are initiation points for nanowire growth and are areas of stress concentration located in, and more particularly on, the surface of the composite film. Locations of stress concentration(s) can include, but are not limited to, naturally occurring and artificial areas of film discontinuity such as naturally or artificially induced fractures, fault lines, as well as localized point concentration(s) such micro-pinholes and the like.

The rate of nanowire growth appears to be non-linear. The rate of nanowire growth or emission is related to the relaxation of initial elevated compressive stress with the highest rates of nanowire growth occurring during the initial phases of compressive stress relaxation. The emission of nanowire material can proceed for any desired interval. However, it is believed that the most productive or proficient interval of nanowire formation occurs in the initial stages of compressive stress relaxation. Production efficiency is believed to decrease as residual compressive stress is relaxed.

It is believed that the production of nanowire is formed by a process of residual stress-induced extrusion on the microscopic scale. Extrusion typically occurs at intervals of discontinuity or fracture in the thin film surface with the rate of growth decreasing over time. Greatest intervals of growth appear to occur within the first interval of reduction of the first elevated compressive stress. The interval of greatest nanowire growth is in the first 24 to 48 hours with the greatest productivity being in the first 24 hours.

The nanowire produced as a result of the process of the present invention is typically one which is composed of the metallic material of the first phase with little or no evidence of second phase matrix material integrated therein. The nanowire is typically a wire formed of single crystalline regions which can be hundreds of micrometers in length. In one embodiment, the single crystalline region may be at least. 50 microns. The single crystalline material can have any suitable structure such as the bulk rombohedral structure for bismuth nanowire. The nanowire thus produced will have a diameter less than about 200 nanometers, with diameters between 10 and 200 nanometers being preferred. The nanowire produced by the process of the present invention has an aspect ratio greater tan about 100; with aspect ratios as great as 100,000 being possible. It is believed that the diameter of the resulting nanowire is a function of the size of the initiation point in the thin film.

In preparing the composite film of the present invention, it has been found that metallic nanowires emanate or are emitted immediately upon completion of the codeposition film formation process from various fractures or surface imperfections formed on the thin film. The process of the present invention also contemplates a method and materials for preventing immediate or spontaneous production of nanowires in which a suitable cap or layer is placed in overlying relationship with the thin film immediately upon completion of the codeposition film formation process. The cap or layer is one which is capable of covering or blocking the fractures or surface imperfection sites from which the nanowire emanates, thereby maintaining initial compressive stress and preventing nanowire growth. The process of the present invention contemplates that the cap can be wholly or partially removed to initiate nanowire emission. Thus, the cap layer will arrest growth and permit delayed release of metallic nanowire from the associated matrix at a time desired.

Thus the present invention also contemplates a metallic nanowire growth structure 10 in which nanowire growth can be delayed and/or controlled. The delayed nanowire growth structure 10 comprises a composite film 12 having at least a host matrix phase 14 and a diffused metallic phase 16 in which the host phase and metallic phase have a melting temperature differential of at least 30%. The composite film has a compressive stress greater than 200 MPa and a sheath overlying fracture or initiation points 20.

Figure 2:
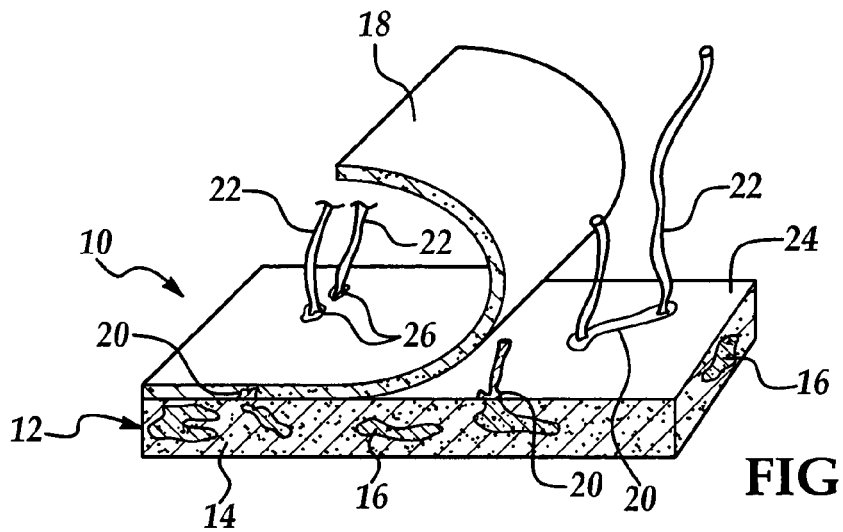
FIG. 2 is a perspective view of delayed release metallic nanowire structure of an embodiment of the present invention.

The sheath 18 or cap may be composed of any suitable material which can overlay exposed surfaces of the composite film 12 and associated fracture points 20 in a suitable adhering relationship to prevent extrusion of metallic material from fracture points 20. As depicted in FIG. 2, the sheath 18 is a layer overlaying the upper surface 24 of composite film 12. The sheath 18 is a material which can adhere to the composite film 12 to prevent or, at minimum, retard extrusion of metallic nanowires and maintain the inherent compressive stress at or near the initial compressive stress preset thin film formation. Materials which can be employed in the sheath 18 can include materials such as non-reactive polymers, metals, ceramics, and the like.

As depicted in FIG. 2, the sheath 18 is partially removed from contact with the upper surface 24 of composite film 12. Such removal initiates extrusion and growth of nanowires 22 from newly exposed fracture or stress concentration points 20.

In certain instances, it is also contemplated that nanowire growth can be initiated from the nanowire growth structure 10 of the present invention by scoring, scratching or piercing the sheath 18 in a manner which imparts or exploits underlying stress concentration points or regions in the composite film. This results in nanowires 22 emitting through associated orifices 26 produced in the sheath 18.

Figure 3:
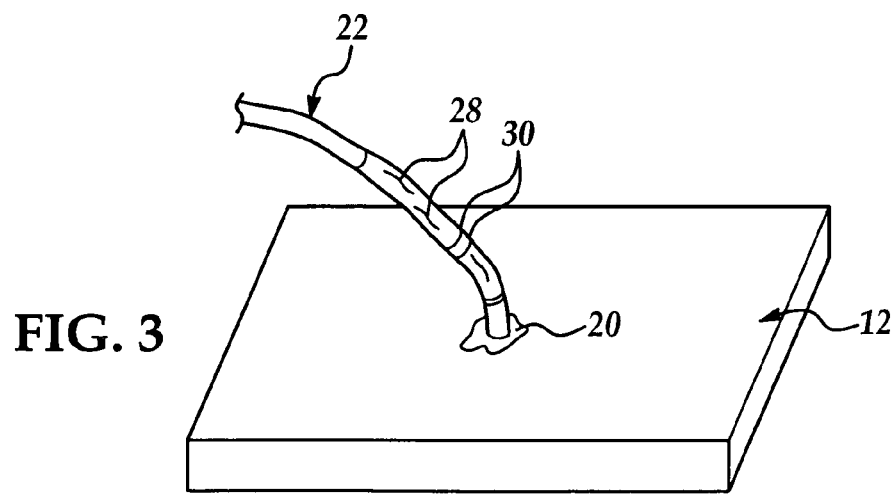
FIG. 3 is a perspective view of metallic nanowire of an embodiment of the present invention.

A portion of nanowire 22 is depicted in FIG. 3 emanating out of associated thin film 12 through a stress concentration point 20 such as a circular buckling crack, pinhole defect, or boundary between columnar features as are common morphology of thin films formed by physical vapor deposition. Nanowire 22 can have extrusion marks such as ridges 28. Additionally nanowire 22 can have continuous bend contours 30 across the diameter of the nanowire which is indicative of the single crystal nature of the metallic nanowire 22.

To further describe the present invention, the following examples are set forth. The examples are for illustrative purposes and are not to be construed as limitations of the present invention.

EXAMPLE I

The various thin films of bismuth in a host matrix of chrome nitride (CrN) were prepared in a commercial closed field unbalanced magnetron sputtering system (Teer 550). Four sputter targets arranged in a rectangular geometry were used for depositions. Targets were of 99.99% pure Cr and one was of 99.9% pure Bi. Films were deposited on single crystal (Si)111 substrates. The substrates were cleaned ultrasonically in acetone and methanol before introduction into the vacuum chamber. The base pressure of the vacuum system was $6 \times 10^{-6}$ torr. Immediately before deposition, the substrates were argon ion etched for about 30 minutes with the substrates biased at −400V. An adhesion promotion layer of pure Cr of approximately 100 to 200 nm thickness was deposited first in pure Ar. The composite thin films were then deposited by rotating the substrates to sequentially face the four targets, using a sputtering gas mixture of 43% argon and 57% nitrogen. The purity of argon and nitrogen was 99.999% and 99.99% respectively. The substrate bias voltage was −60V for all samples. It was applied during etching and deposition as voltage pulses of 500 nsec plus width and 250 kHz frequency. The substrate rotation speed was such that about 10 nm thickness of material was deposited during each revolution. The total thicknesses of the films produced ranged from 1.5 to 2.5 micrometers. The substrate temperature was less than 150° C.

Composition and purity of the films were determined by electron probe microanalysis (EPMA) and Auger depth profiling. The bismuth concentration was adjusted from 0.5 to 4.3% by varying the power on the bismuth target while maintaining constant power on the chrome target. X-ray diffraction (XRD) shows that the films consisted of a mixture of elemental bismuth and chrome nitride (CrN). Thin films of CrN and elemental Bi were also made under similar sputtering conditions for purity studies. The oxygen and carbon impurities in the CrN film were found to be less than the detection limits of EPMA, which is about 0.1 at. %. The total oxygen impurity in the bismuth film was 2 to 3 at. %, including surface oxides.

EXAMPLE II

Figure 4A:
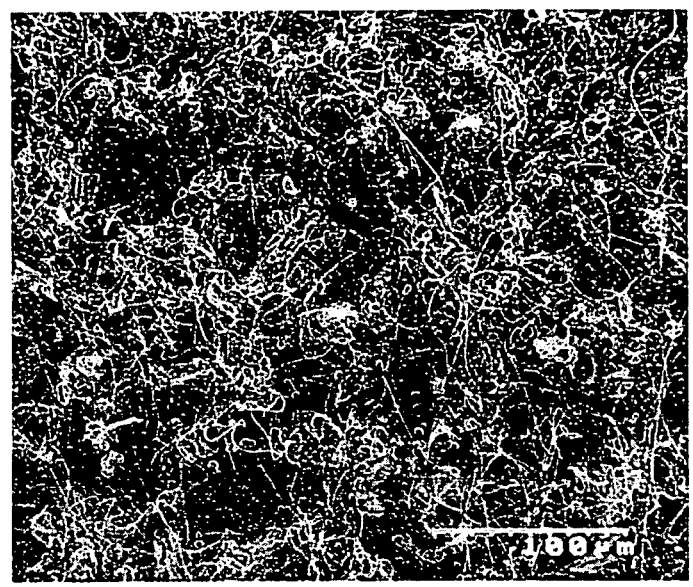
FIG. 4A is a low magnification scanning electron microscope image of nanowires prepared according to a method of the present invention showing a panoramic view of the sample surface with bismuth nanowires.
Figure 4B:
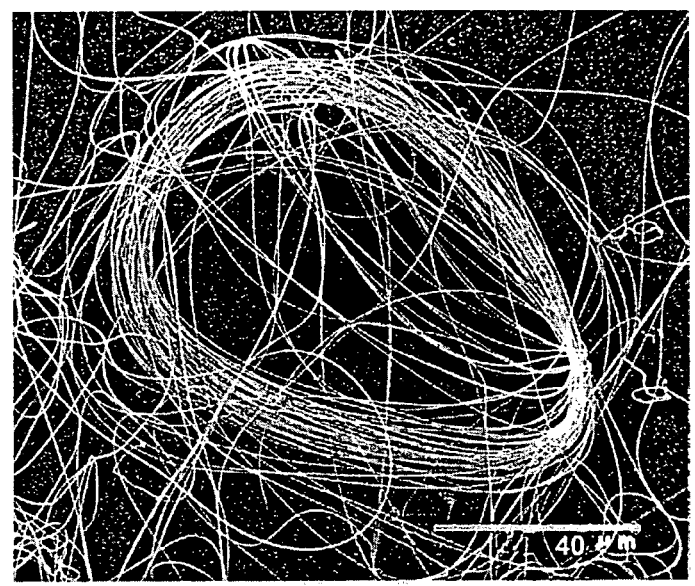
FIG. 4B is a scanning electron microscope image of a high aspect ratio bismuth nanowire on the sample surface of a composite film prepared according to a method of the present invention.

Films made according to the process outlined in Example I were inspected using scanning electron microscopy (SEM) imaging. An abundance of wires was found on the surface of the composite films inspected as evidenced from the low magnification SEM image (see FIG. 4A) that gives a panoramic view of the sample surface. The wires were approximately circular in cross-section with diameters ranging from about 30 to 200 nanometers. Most wires were very long compared to their diameter and compared to the thickness of the thin film. A conservative estimate of the length of the wire loop shown in FIG. 4B suggests that it was at least several millimeters in length. Various other samples were inspected and such lengths were typically observed among the wires. The highest aspect ratio of the wires was calculated to be at least 100,000.

Figure 4C:
FIG. 4C is a detailed SEM image of composite film prepared according to a method of the present invention showing an individual nanowire emerging from a pinhole defect initiation point.

The thin films with associated wires were inspected to determine the locations of wire emergence. Inspection indicated that wires appeared to emerge from locations on the respective surfaces where pin hole defects existed. Other wires appeared to emerge from boundaries between columnar features that are a common morphology feature of the thin films formed by physical vapor deposition (see FIG. 4C). Occasionally, a circular buckling crack was observed around an associated wire. The circular buckling crack indicated evidence of the high stress associated with the formation of the wires.

The thin film was analyzed for compressive stress. A compressive stress of about 470 MPa was observed in a thin film prepared according to the method of Example I deposited on a silicon substrate using the wafer curvature method and technique and Stoney's equation. The wires were further inspected and showed evidence of extrusion marks. These observations further supported the hypothesis that the wires were formed by residual stress-induced extrusion on the microscopic scale.

EXAMPLE III

Figure 5A:
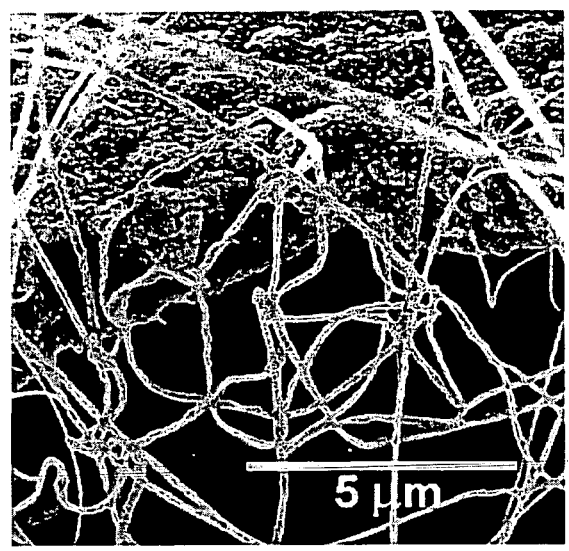
FIGS. 5A and 5B are SEM images of the same area of composite film prepared according to a method of the present invention prepared as a fracture sample with the respective images taken five minutes apart.
Figure 5B:
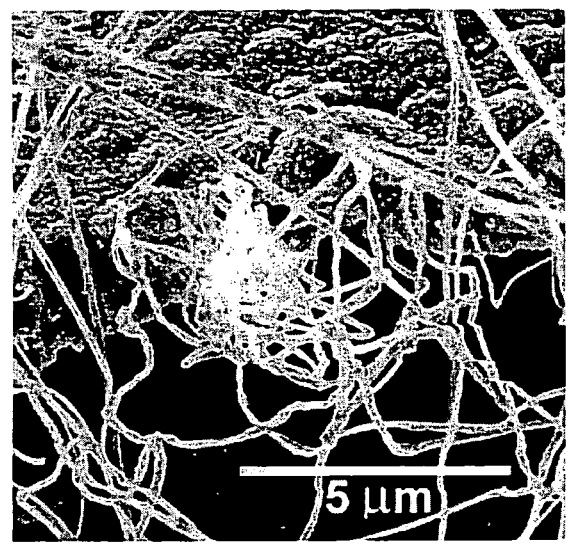

To further demonstrate that bismuth nanowires were formed by stress, extrusion, films deposited on silicon substrates according to the method of Example I were fractured and viewed in cross-section in SEM. FIGS. 5A and 5B present two SEM images of the same area of a fractured sample taken 5 minutes apart. The SEM images clearly showed that some of the wires grew from the freshly fractured surface during SEM observation. A number of wires were observed to grow from the newly fractured surface inside the SEM. Extremely high growth rates of about 5 micrometers per second were observed. Nanowire growth rate in various samples was observed over time. It was found that the rate of nanowire growth decreased with time with the greatest rate of growth occurring during the first 24 hours after film formation.

EXAMPLE IV

Figure 6:
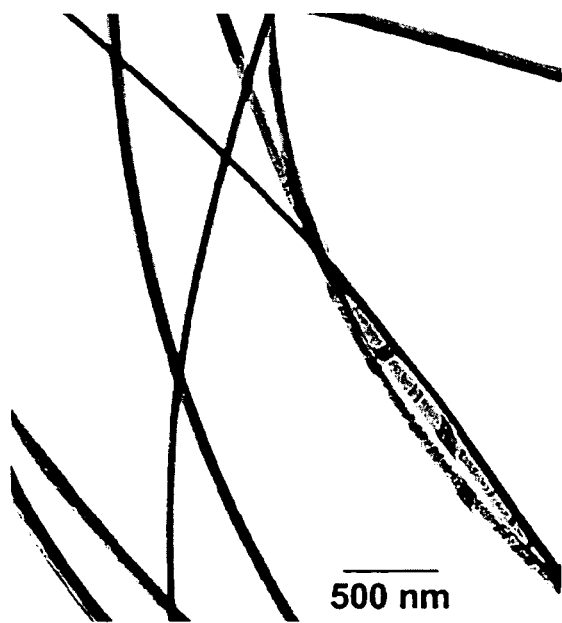
FIG. 6 is a transmission electron microscope image of several bismuth nanowires prepared according to a method of the present invention.

Nanowires produced from thin film composites prepared according to the method of Example I were analyzed to characterize nanowire structure and composition. Various nanowires wires were further examined using TEM together with energy dispersive x-ray spectroscopy (EDS). The EDS analysis detected bismuth with little or no chrome. This suggested that most of the bismuth wires were formed after completion of the co-deposition process. FIG. 6 is a TEM photo of several bismuth wires prepared according to the process outlined in Example 1. The nanowires showed evidence of a series of continuous bend contours across their respective diameters when viewed in the TEM micrograph. This phenomenon indicated that the nanowires are composed of single crystals. The electron diffraction patterns showed that the structure of the nanowires are bulk bismuth rombohedral structure. Selective area electron diffraction of single nanowires also indicated that the wires were single crystals, though no predominate axis was identified. The single crystalline regions along the wires averaged several hundreds of microns in length. Occasional grain boundaries were observed at kinks along the wires.

While the invention has been described in connection with what is presently considered to be the most practical and preferred embodiment, it is to be understood that the invention is not to be limited to the disclosed embodiment but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A metallic nanowire composed of at least one of bismuth, indium, tin, lead, zinc, antimony, alloys containing bismuth, alloys containing indium, alloys containing tin, alloys containing lead, alloys containing zinc and alloys containing antimony, the metallic material present in at least one single elongated crystal having an aspect ratio of greater than or equal to 100,000.

2. The metallic nanowire of claim 1 wherein the material of composition is at least one of bismuth, indium, tin, lead, zinc and antimony.

3. The metallic nanowire of claim 1 wherein the single crystalline region is at least 50 microns.

4. The metallic nanowire of claim 1 wherein the nanowire has a diameter less than about 200 nanometers.

5. The metallic nanowire of claim 1 wherein the diameter is greater than 20 nanometers.

6. The metallic nanowire of claim 1 wherein the nanowire includes at least one extrusion mark.

7. Metallic nanowires formed by a method comprising:
forming a composite film, such that the composite film of at least two phases has at least one outwardly oriented surface, wherein a first phase is a metallic material, the metallic material including at least one of bismuth, indium, tin, lead, zinc, antimony, alloys containing bismuth, alloys containing indium, alloys containing tin, alloys containing lead, alloys containing zinc and alloys containing antimony, and a second phase functions as a host matrix, the composite film emitting nanowires from the at least one outwardly oriented surface, the nanowires composed of the metallic material of the first phase and having an elongated crystalline structure, a diameter less than about 500 nanometers and an aspect ratio of greater than or equal to 100,000.

8. Metallic nanowires formed by a method comprising:
forming a composite film having at least two phases, wherein at least one phase contains a metallic compound, and at least one host matrix phase contains at least one of nitrides, carbon, oxides, borides, and mixtures thereof, the composite film having an initial high elevated compressive stress, at least one initiation point, and at least one outwardly oriented surface;
establishing a layer on at least a portion of the at least one outwardly oriented surface, the layer composed of at least one material which is essentially non-interactive with materials contained in the composite film, the layer being at least partially removable relative to the outwardly oriented surface of the composite film; and
at least partially removing the layer from the outwardly oriented surface, thereby initiating extrusion of the metallic nanowires from the outwardly oriented surface;
wherein each of the metallic nanowires is composed of the metallic compound of the first phase and has an elongated crystalline structure, a diameter less than about 500 nanometers and an aspect ratio of greater than or equal to 100,000.

* * * * *